(12) United States Patent
Chen

(10) Patent No.: US 7,099,233 B2
(45) Date of Patent: *Aug. 29, 2006

(54) PARALLEL ASYNCHRONOUS PROPAGATION PIPELINE STRUCTURE AND METHODS TO ACCESS MULTIPLE MEMORY ARRAYS

(76) Inventor: Chaowu Chen, 4562 Encanto Way, San Jose, CA (US) 95135

( * ) Notice: Subject to any disclaimer, the term of this patent is extended or adjusted under 35 U.S.C. 154(b) by 0 days.

This patent is subject to a terminal disclaimer.

(21) Appl. No.: 11/268,825

(22) Filed: Nov. 7, 2005

(65) Prior Publication Data

US 2006/0050603 A1 Mar. 9, 2006

Related U.S. Application Data

(62) Division of application No. 10/916,087, filed on Aug. 10, 2004, now Pat. No. 6,963,517.

(60) Provisional application No. 60/494,410, filed on Aug. 11, 2003.

(51) Int. Cl.
*G11C 8/00* (2006.01)
(52) U.S. Cl. .................. 365/233; 365/230.03
(58) Field of Classification Search ............. 365/233, 365/230.03, 230.06, 194
See application file for complete search history.

(56) References Cited

U.S. PATENT DOCUMENTS

| 5,548,560 | A  | * | 8/1996  | Stephens et al. | ......... | 365/233.5 |
| 6,178,138 | B1 | * | 1/2001  | Derbenwick et al. | ....... | 365/233 |
| 6,490,225 | B1 | * | 12/2002 | Millar et al. | ................ | 365/233 |
| 6,539,454 | B1 | * | 3/2003  | Mes | ........................... | 711/105 |
| 6,744,690 | B1 | * | 6/2004  | Parris | .................... | 365/230.03 |
| 6,834,015 | B1 | * | 12/2004 | Yoon | ..................... | 365/189.05 |

\* cited by examiner

*Primary Examiner*—Anh Phung
(74) *Attorney, Agent, or Firm*—Bo-In Lin

(57) ABSTRACT

A method is disclosed to carry out a data access operation in a data memory device that is subdivided into a plurality of memory arrays each array includes a plurality of memory cells accessible by an identifiable address. The method includes a step of asynchronously propagating in parallel a plurality of data access signals, each through a data access path over multiple propagation stages of signal lines interconnected between the memory arrays and each of the multiple propagation stages implementing an asynchronous local clock for receiving and sending said data access signals for carrying out said data access operation. The method further includes a step of adding a path delay in a selected set of the propagation stages to minimize a length of time difference in carrying out the data access operations through each of the different data access paths. The method further includes a step of generating a pulse train in each of the propagation stages for inputting to the local clock of a subsequent propagation stage for initiating the local clock of the subsequent propagation stage for propagating the data access signals.

23 Claims, 12 Drawing Sheets

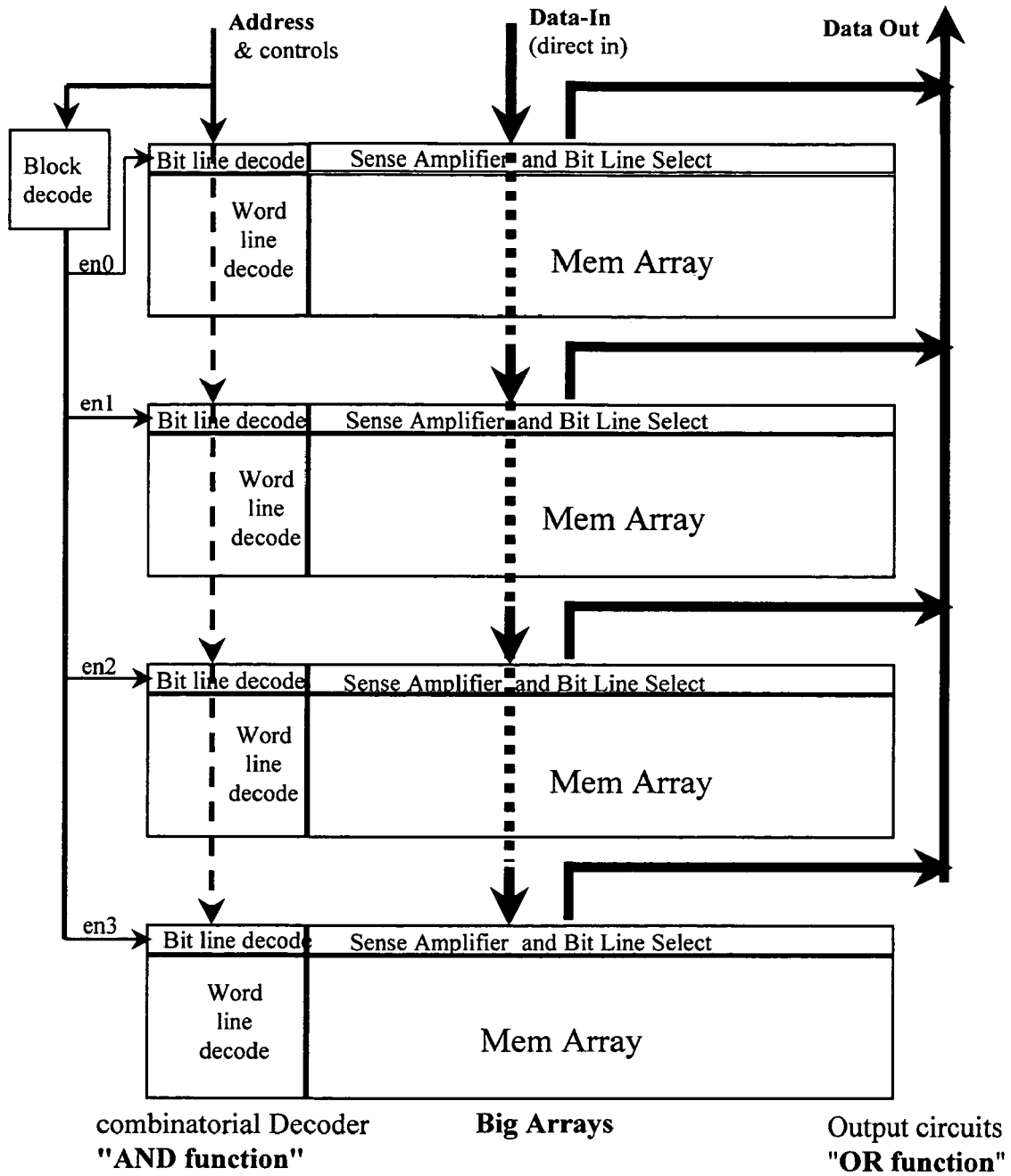
Fig. 1 Block Diagram of A
Conventional Multi-Block Memory (Prior Art)

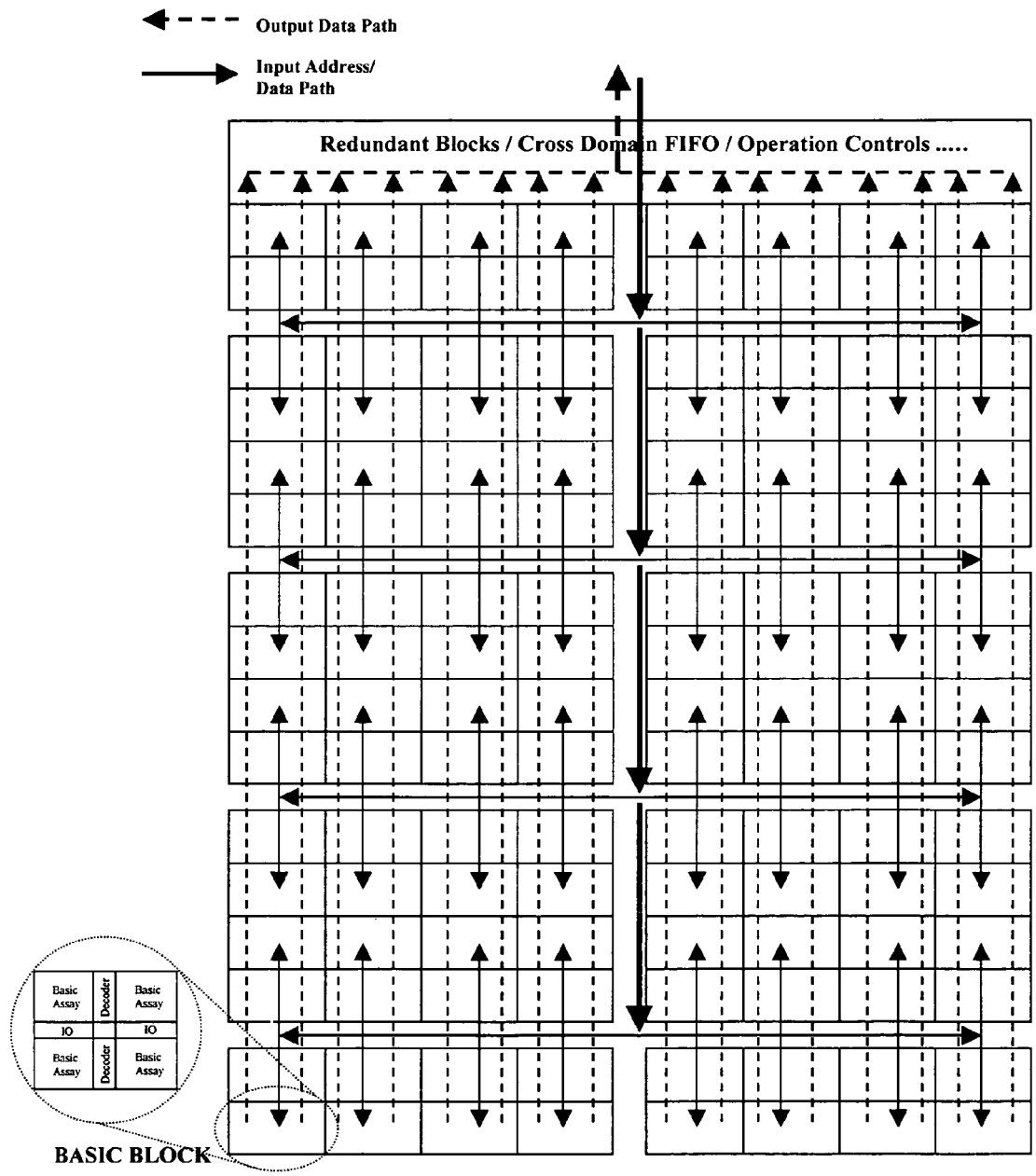
Fig. 2B An Exemplary Fishbone Layout Floor Plan

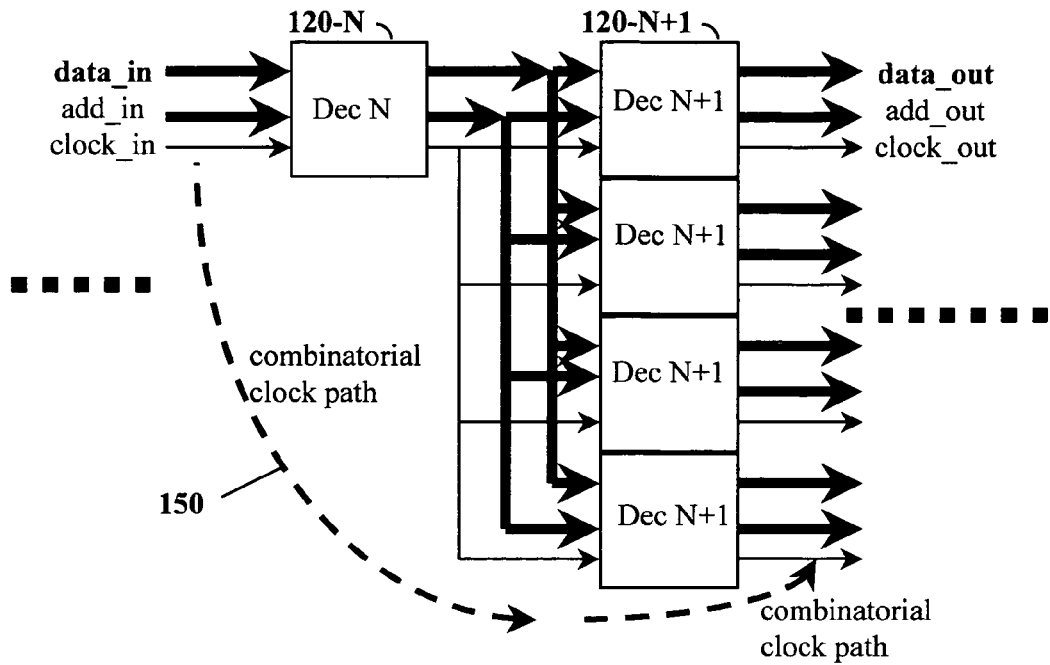
Fig. 3 Schematic of propagation Pipeline Decoder Stages
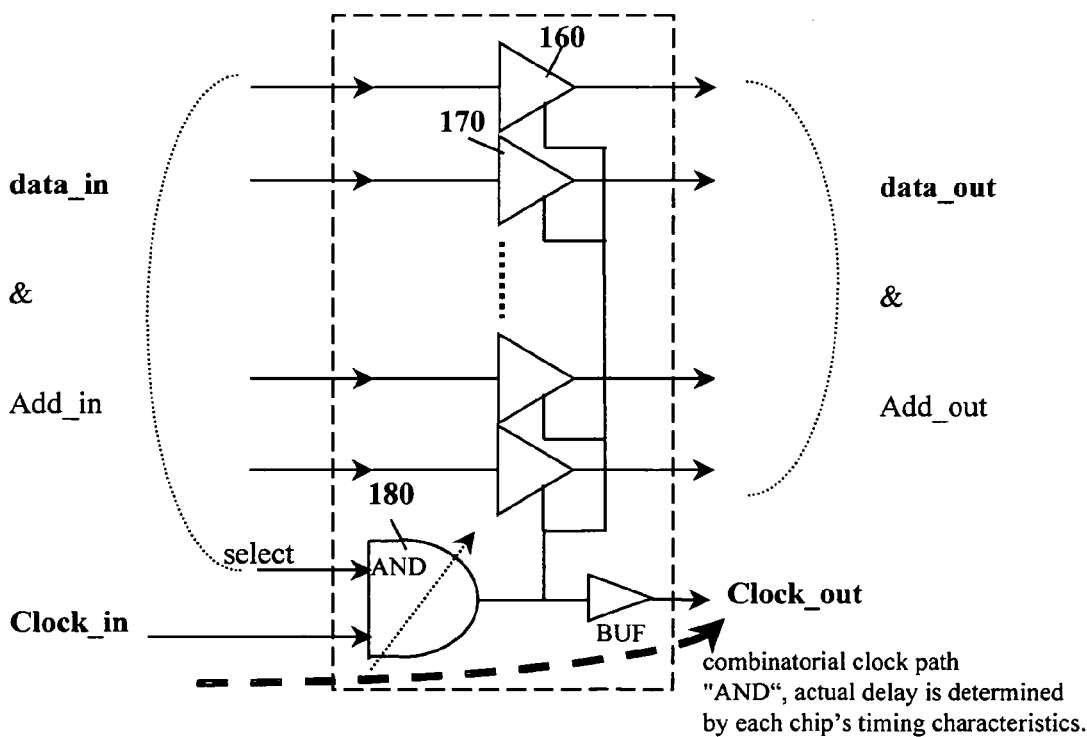
Fig. 4 Schematic of the propagation Pipeline Decoder

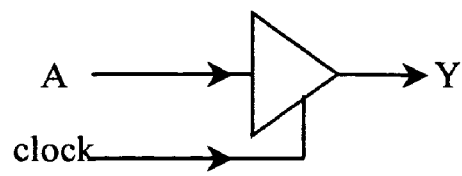
Fig. 5A-1
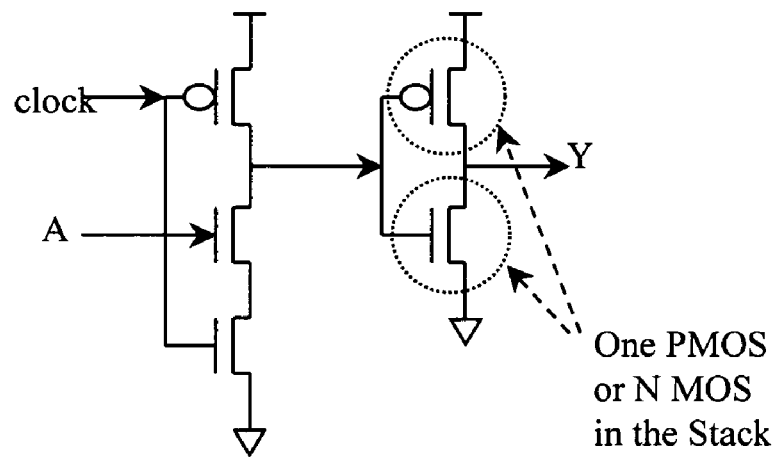
One PMOS or N MOS in the Stack
Fig. 5A-2
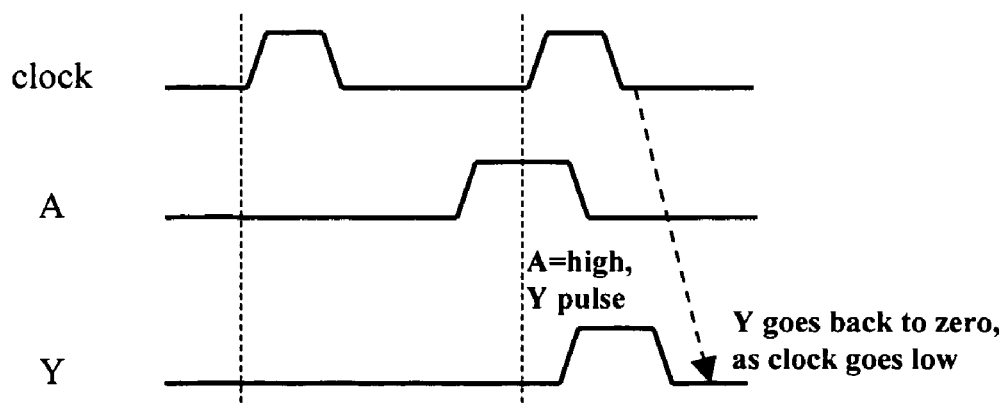
A=high, Y pulse
Y goes back to zero, as clock goes low
Fig. 5A-3 Timing Diagram of Signals Of Figs. 5A-1 and 5A-2

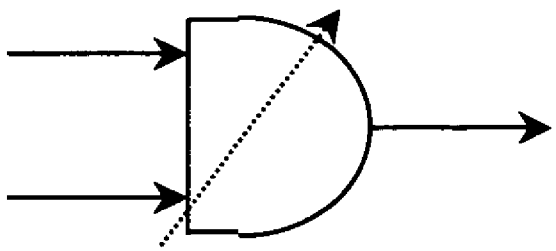
Figs. 5B-1 A Symbol
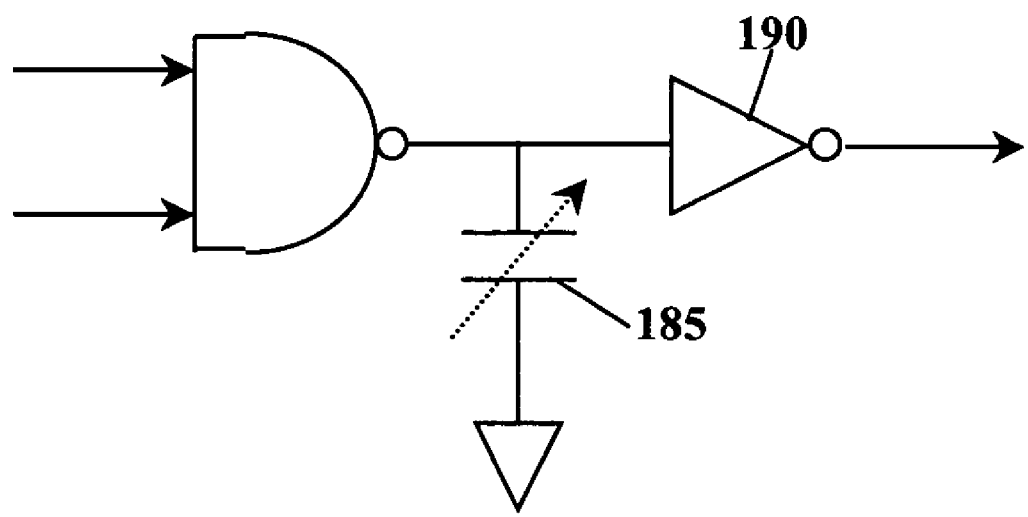
Fig. 5B-2 Circuit Schematic in the Programmable Clock Driver

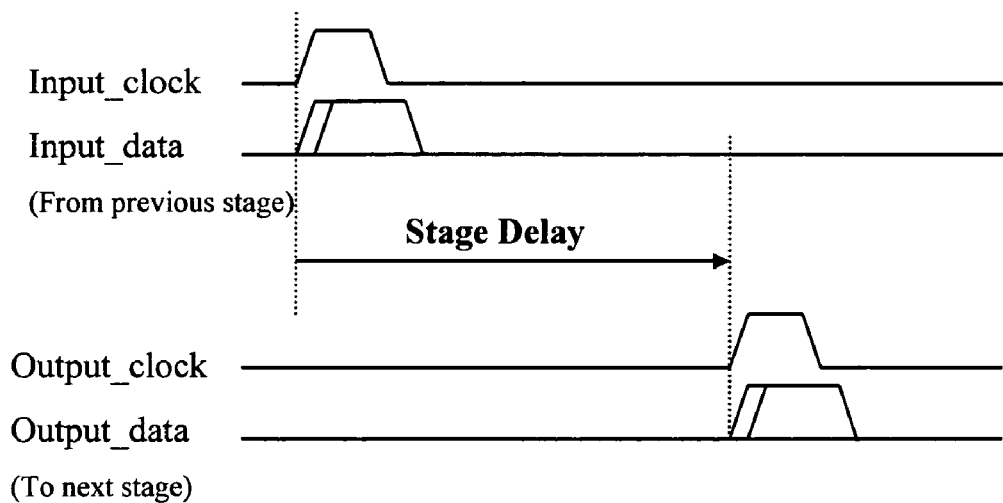
Notes: Both data are shown in RTZ type, which means it returns to low, after clock goes low.
Fig. 5C Relative Stage Clocks / Data & Delay

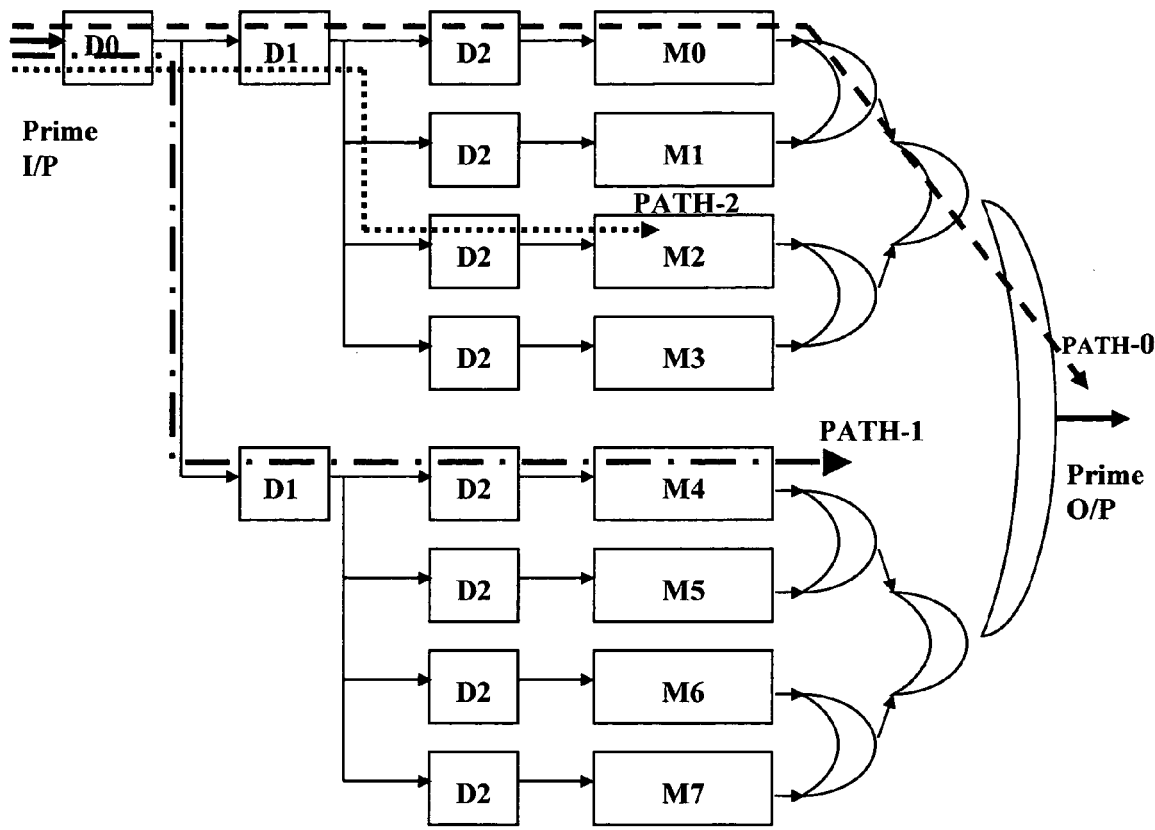
Fig. 5D Example of multiple operations through multiple interleaved Paths

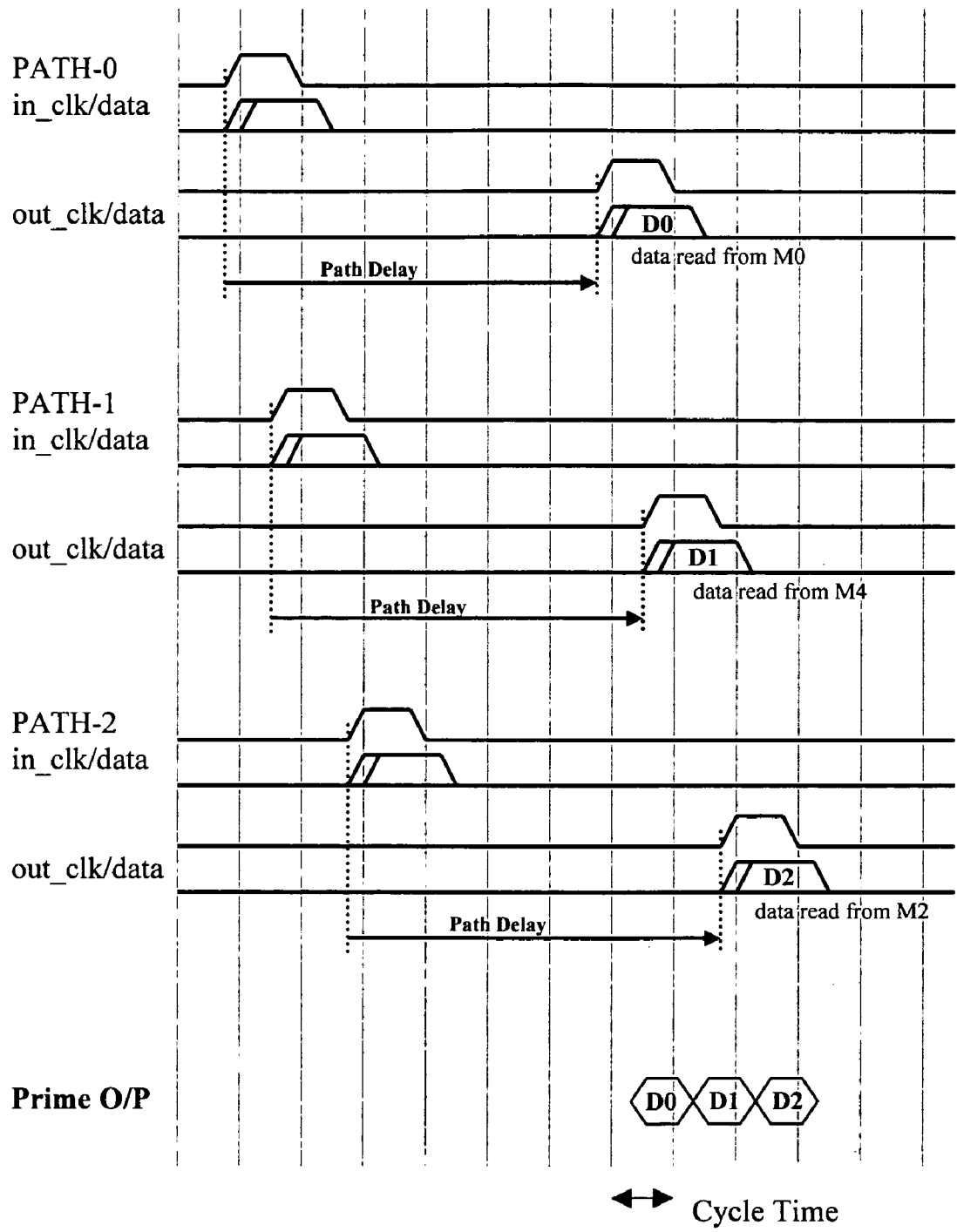
Fig. 5E Relationship of the cycle time &
The balanced delay time among all access paths

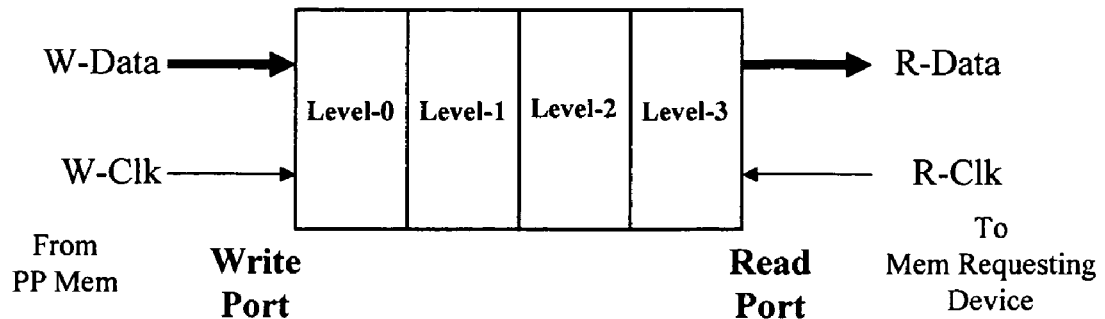
Fig. 6A  4-Level Clock Domain Crossing FIFO
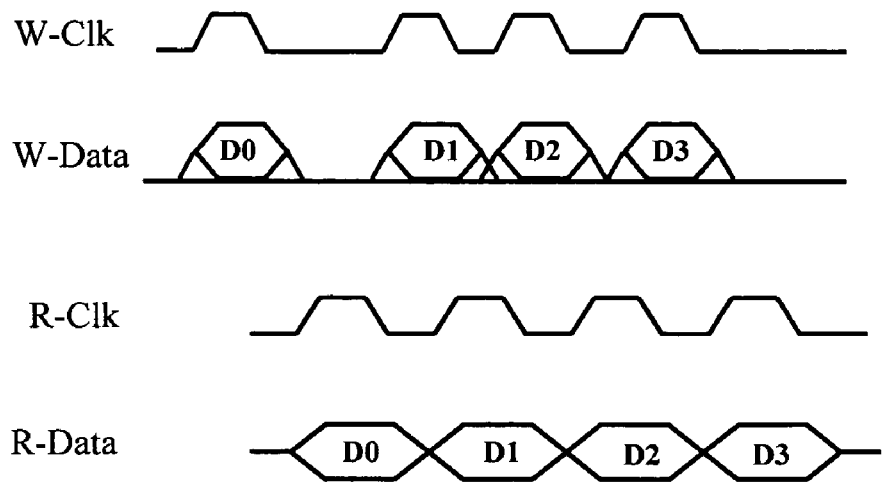
**Fig. 6B  Asynchronous or Irregular write clock and data
& Synchronous Read clock and data**

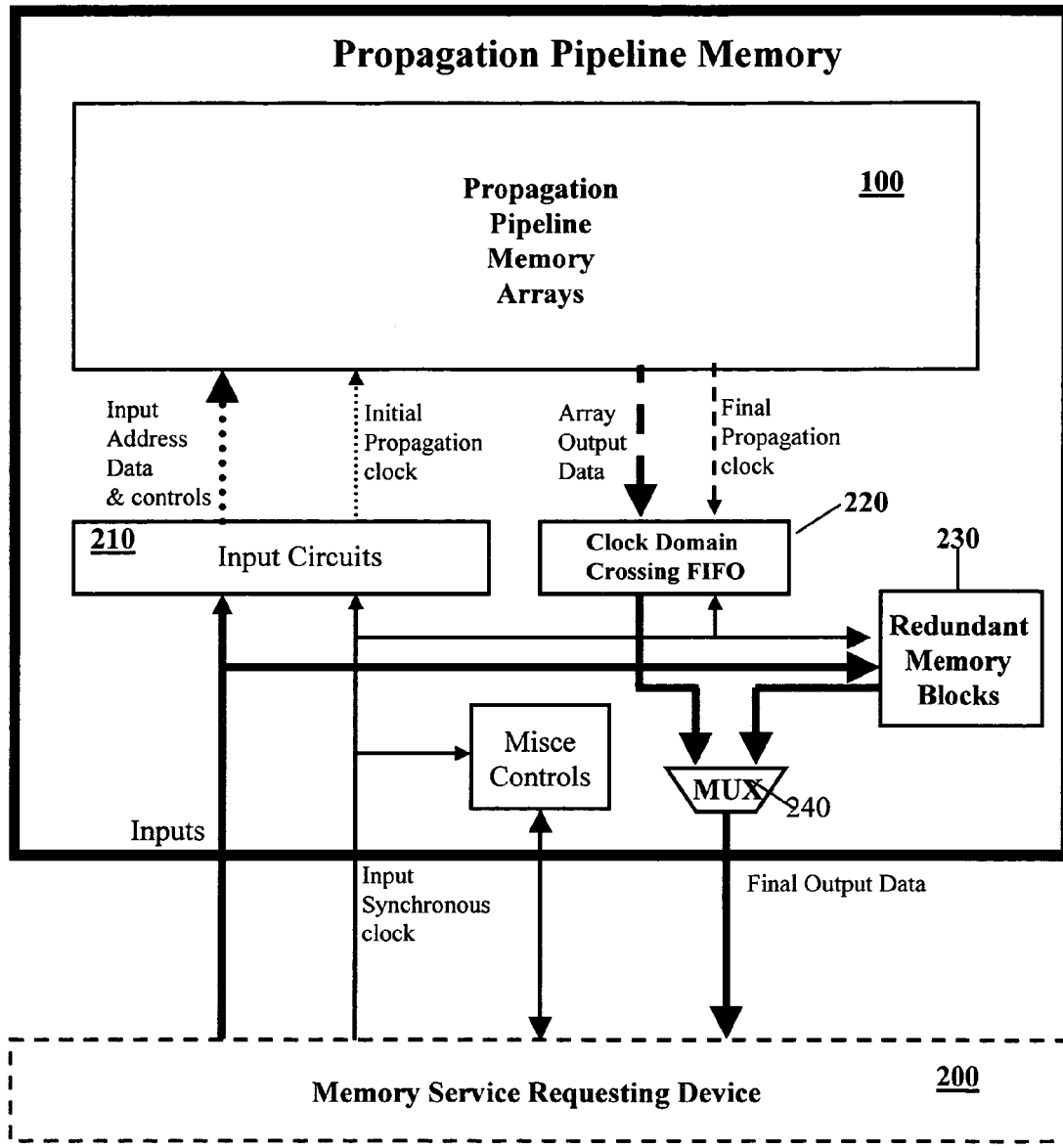
Fig. 6C An Exemplary Clocking Scheme of
the Propagation Pipeline Memory
(redundant blocks are in the client clock domain)

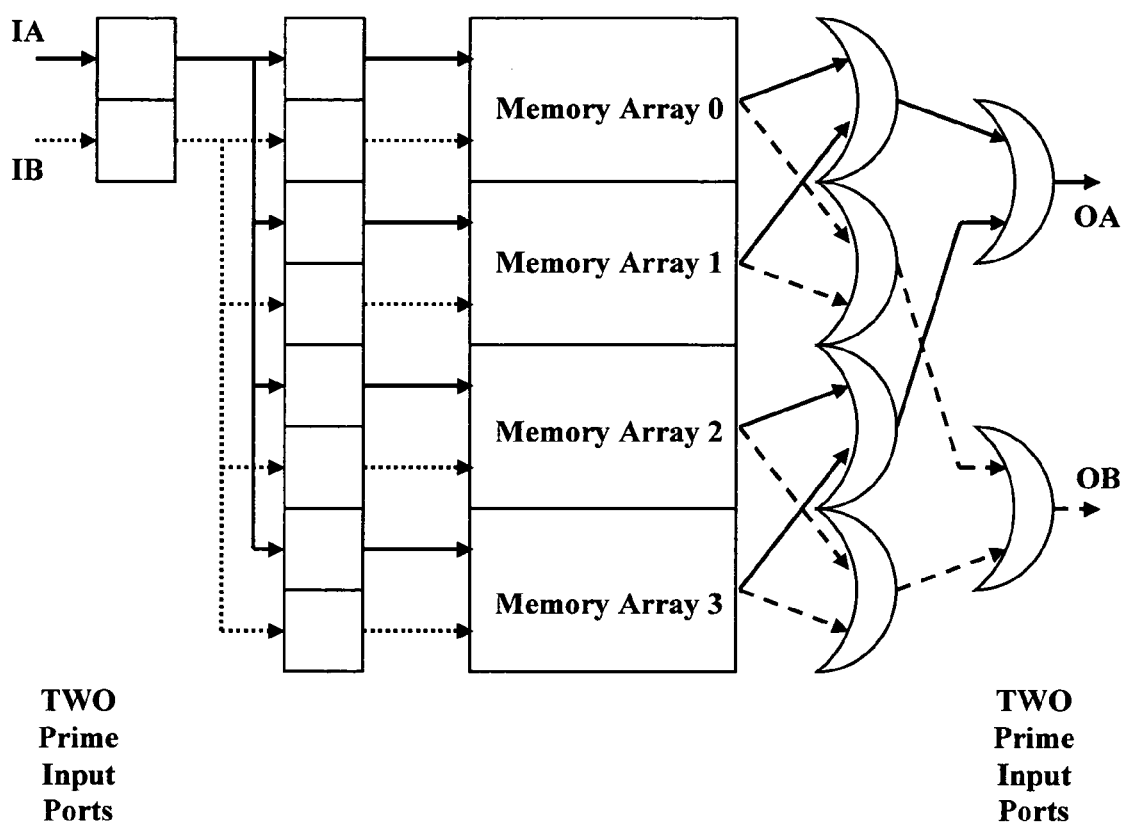
Fig. 7 A Dual Input & Dual Output Port
Memory Array Block Diagram

PARALLEL ASYNCHRONOUS PROPAGATION PIPELINE STRUCTURE AND METHODS TO ACCESS MULTIPLE MEMORY ARRAYS

This application is a Divisional Application and claims priority to pending U.S. patent application entitled "A PARALLEL ASYNCHRONOUS PROPAGATION PIPELINE STRUCTURE TO ACCESS MULTIPLE MEMORY ARRAYS" filed on Aug. 10, 2004 now U.S. Pat No. 6,963, 517, issued on Nov. 8, 2005 and accorded Ser. No. 10/916, 087. The application Ser. No. 10/916,087 is a Formal Application that claims a priority to a Provisional Application entitled "A HIGH THROUGHPUT PROPAGATION PIPELINE MEMORY STRUCTURE" filed on Aug. 11, 2003 by Chao-Wu Chen and accorded Ser. No. 60/494,410 the benefit of its filing date being hereby claimed under Title 35 of the United States Code.

BACKGROUND OF THE INVENTION

1. Field of the Invention

This invention relates generally to apparatuses and methods for reading and writing data to a semiconductor memory arrays. More particularly, this invention relates to new and improved memory decoding propagation circuit design and configurations and data access methods to achieve shortened data cycle time to achieve high data access rate.

2. Description of the Related Art

Conventional technologies of data access for reading and writing data to memory arrays configured as multiple blocks are limited by the long cycle time due to the requirements of reading and writing larger arrays to achieve better area efficiency and faster access time and the latency in waiting for the global clock synchronization if synchronous pipeline structure is used for address decoding and data read and data write operations.

FIG. 1 shows a conventional multi-block or parallel memory structure, which comprises a block decoder circuit used to select one of the four sub-blocks. Each sub-block comprises a bit line decoder, a word line decoder, IO cells (sense amplifiers/write drivers), and a memory array. It should be mentioned that in a memory structure as shown in FIG. 1, the address decoder portion overall is an AND structure to perform the memory select function, and in the data output portion, the OR logic is implemented wherein OR devices or wired-OR connections are employed over multiple stages to perform the output data merging function. This multi-block memory structure are commonly implemented for each of the following memory types: SRAM, DRAM, ROM, PROM, EPROM, EEPROM, and FLASH.

For the purpose of optimizing a memory device design, it is more area efficient to have large memory arrays than having many smaller memory arrays, because large memory arrays require fewer interconnections, fewer decoders, and fewer IO circuits. However, large array requires more time to process the word line select, bit line select, bit line sensing, and bit line pre-charge. Therefore, larger array usually results in a longer cycle time. On the other hand, a memory device with larger array size have less number of blocks thus requiring less decoding time and tend to have better access time when compared with the access time of a memory device that has smaller size array but larger number of blocks. Therefore, there is no simple clear-cut solution to optimize the floor plan of a memory device. Depending on particular design requirements and the design specifications, in the process of designing a memory device, a designer is often required to trade off between the area and the access time to make a compromise. Therefore, a need still exists in the art to provide an innovative configurations and method of circuit implementation for data access with significantly shortened cycle time without sacrificing much area costs such that the above discussed difficulties and limitations of the prior art technologies can be resolved.

SUMMARY OF THE INVENTION

It is therefore an object of the present invention to provide a new data access path configuration and asynchronous pipeline branching propagation. In this new memory device, parallel asynchronous data access signals are propagated through multiple stages with properly adjusted stage delay to balance the delay among all data access paths such that the data access cycle time is no long dependent on a longest stage delay while a much shorter cycle time is achieved with a dependence on the difference between delay times of different access paths. Significantly reduced cycle time is therefore achieved to allow simplified data access branching structure and control process such that an area efficient implementation of the memory device is also provided with higher operation frequency.

Specifically, this invention discloses special pulse train driver is implemented in each data access branching stage operated with local clock according to a return to zero (RTZ) circuit design such the asynchronous propagation can be easily managed with properly adjusted time delay. Parallel propagation of data access signals are carried out in a time-sharing multiplexing propagation to access the data in different memory arrays in every two consecutive data access operations such that high frequency and short cycle time are achieved with simplified data access decoding propagations without requiring synchronization process to align timing skew in each stage thus simplifies the memory design and reduces the power consumptions with shorter data path connections.

Briefly, the present invention discloses a method for carrying out a data access operation in a data memory device subdivided into a plurality of memory arrays each array having a plurality of memory cells accessible by an identifiable address. The method includes a step of asynchronously propagating in parallel a plurality of data access signals, each through a data access path over multiple propagation stages of signal lines interconnected between the memory arrays and each of the multiple propagation stages implementing an asynchronous local clock for receiving and sending said data access signals for carrying out said data access operation. In a preferred embodiment, the method further includes a step of adding a path delay in each of the multiple propagation stages to minimize a length of time difference in carrying out the data access operations through each of the different data access paths. In another preferred embodiment, the method further includes a step of generating a pulse train in each of the propagation stages for inputting to the local clock of a subsequent propagation stage for initiating the local clock of the subsequent propagation stage for propagating the data access signals.

In accordance with the invention, a memory apparatus is disclosed that includes a plurality of memory arrays each includes a plurality of memory cells accessible by an identifiable address. The memory apparatus further includes a plurality of data access paths divided into a plurality of propagation stages interconnected between the memory arrays wherein each of the propagation stages further implementing a local clock for asynchronously propagating a plurality of data access signals to access data stored in the memory cells in each of the memory arrays. In a preferred plurality of data access paths further includes a multiple stages of decoders for directing the data access signals to propagate through each of the data access paths. In another preferred embodiment, the plurality of propagation stages further comprising a pulse train generator for using the local clock to generate a pulse train for propagating to a subsequent propagation stage to initiate an asynchronous data access signal propagation process in the subsequent propagation stage. In another preferred embodiment, each of the propagation stages further includes a time delay for minimizing a length of time difference between each of the data access paths in carrying out the data access operation.

BRIEF DESCRIPTIONS OF THE DRAWINGS

The present invention can be better understood with reference to the following drawings. The components within the drawings are not necessarily to scale relative to each other, emphasis instead being placed upon clearly illustrating the principles of the present invention.

FIG. 1 is a functional block diagram for showing the functional process flow to carry out a data access to a conventional multiple block memory apparatus.

FIG. 2B is a configuration for illustrating the memory layout and data access paths shown as asymmetric comb or fish-one shaped to provide shorter connections and requiring less power consumptions compared with a conventional symmetric H-shape layout.

FIG. 3 is a schematic diagram of the Parallel Propagation Pipeline Decoder Stages.

FIG. 4A is a schematic diagram of the Parallel Propagation Pipeline Decoder.

FIGS. 5A-1 and 5A-2 are Symbol and Schematic of the Pulse Train Driver and FIG. 5A-3 showing the timing diagram of the pulse trains generated by the pulse train drivers.

FIGS. 5B-1 and 5B-2 are functional block diagram for showing the functional configuration of the Programmable Clock Driver.

FIG. 5C is a timing diagram for showing the input clock and the delay output clock when a stage delay is implemented.

FIG. 5D shows a functional block diagram for illustrating multiple data access paths each having different routes through multiple stages of decoders.

FIG. 5E shows the function of the stage delay to reduce the differences among different data access path to achieve a balance data access time among all data access paths to maximize the allowable data frequency.

FIGS. 6A and 6B are a functional block diagram and timing diagram to show the function of a dual clock domain crossing buffer to process a transition between two clock domains.

FIG. 6C is an function block diagram of an overall architecture and data and control flow of a memory access function of this invention that is implemented with an exemplary redundant block clocking scheme of the structure.

FIG. 7 is functional block diagrams for shown a memory device with a dual input ports and dual output ports.

DETAILED DESCRIPTION OF THE PREFERRED EMBODIMENT

Figure 2A:
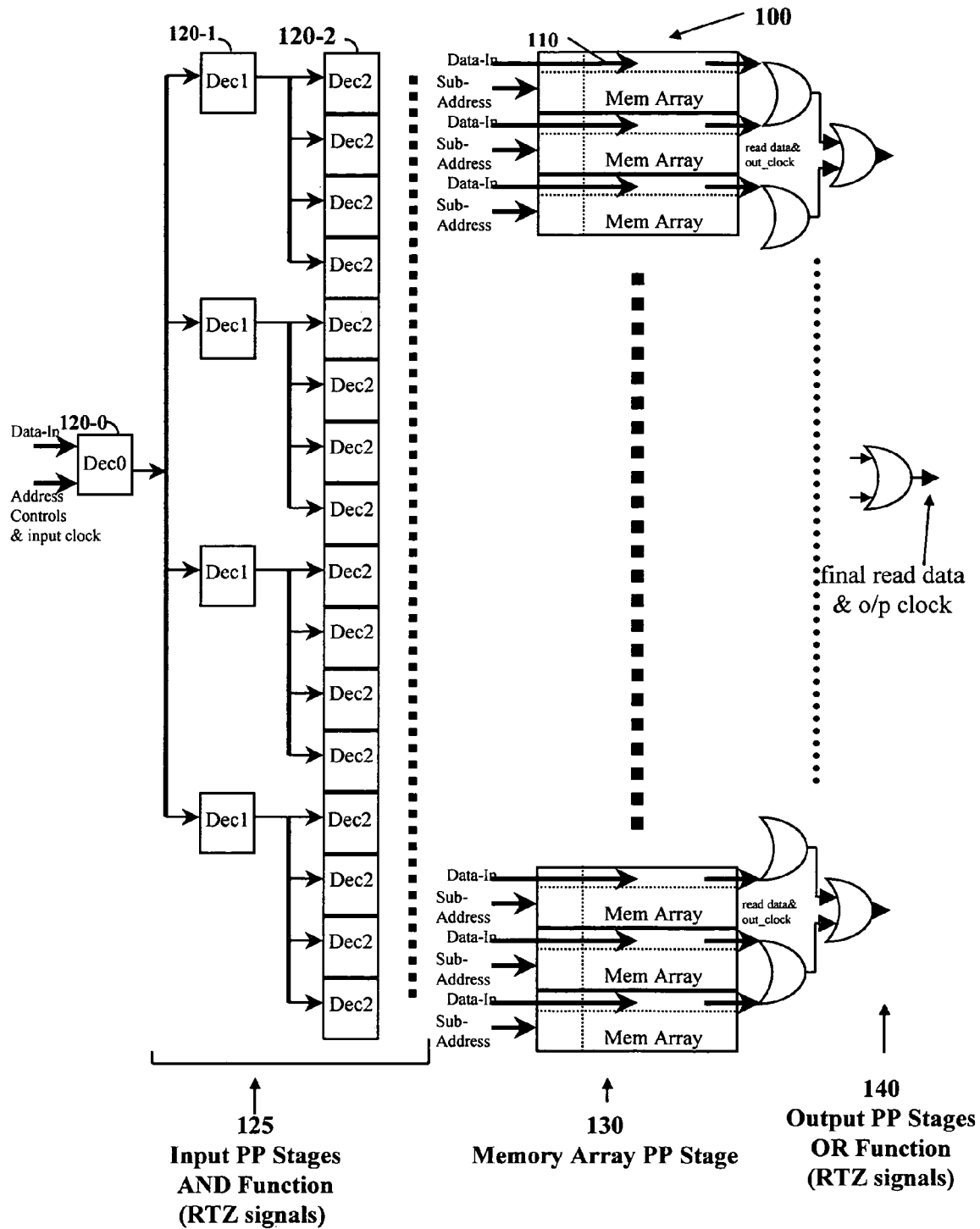
FIG. 2A is a functional block diagram for showing a parallel asynchronous propagation pipeline functional process flow of this invention to carry out a data access to a multiple block memory apparatus.

In the following description, numerous specific details are provided, such as the identification of various system components, to provide a thorough understanding of embodiments of the invention. One skilled in the art will recognize, however, that the invention can be practiced without one or more of the specific details, or with other methods, components, materials, etc. In still other instances, well-known structures, materials, or operations are not shown or described in detail to avoid obscuring aspects of various embodiments of the invention. Reference throughout this specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout this specification are not necessarily all referring to the same embodiment. Furthermore, the particular features, structures, or characteristics may be combined in any suitable manner in one or more embodiments.

Referring to FIG. 2A for a functional block diagram of a memory array 100 that includes a plurality of memory arrays illustrated with multiple hierarchical stages of decoders depicting with tree-structured interconnecting routes to access a plurality of memory arrays 110. Each of these memory arrays is a smallest addressable memory blocks containing one or more memory cells. The access to these memory arrays is through multiple level of branching, i.e., decoding, from a root node DEC0. The branching through the tree structure of decoders 120, e.g., DEC1 to DEC2 etc., is controlled by an address controller (not shown) and carried out according to the propagation-pipeline architecture of this invention. The memory array 100 as shown also includes three sections. The first section 125 is the input propagation pipeline stages to carry out the address decoding operations, the second part is the memory arrays portion 130, and the last is the merging OR function output 140 that includes a plurality of OR gates to generate output data from the output port.

The input address decoders are partitioned into a number of propagation pipeline stages to access memory arrays that are divided into many arrays of small size. Compared with conventional configuration of dividing the memory into many arrays of large block size, the configuration of FIG. 2A significantly reduces the cycle time. Additionally, as will be further discussed in details, the asynchronous propagation pipeline decoding, memory access and outputting processes when implemented with a comb shaped decoding propagation sequence significantly reduce the cycle times.

FIG. 2A is a two-dimensional layout of the memory arrays with interconnected lines for carrying out the data access operations. The interconnected lines are employed to transmit the data access signals including the data access address and associated data. As shown in FIG. 2A, the interconnected lines are divided into a plurality a propagation stages for reaching to different memory arrays. Each stage as shown in FIG. 2A and will be further discussed below are operated with a local clock such that the data access signals are transmitted through the interconnected lines by propagating asynchronously from one stage to next stage until the data access signals are propagated to a memory array. It is very clear from such a layout that the data access paths have different lengths and therefore would reach the memory array in different lengths of time. For the purpose of balancing the length of time required to reach all the memory arrays, an adjustable time delay is placed at each stage to properly adjust the time delay to minimize the length of time required to reach each memory array through different access paths propagated through different stages. The data access operation are therefore carried out by asynchronously propagating in each individual data access path the data access signals for performing the operations of decoding, data access and data output. Unlike the conventional synchronous clock propagation scheme, the data access operations with asynchronous propagation as disclosed this invention does not need to wait for the long global clock cycle time determined by the longest stage delay, based on a conventional synchronous pipeline propagation process. Not only the operating cycle time is significantly reduced but also the complexity of synchronous time management, to assure a synchronous skew-less global clock among many pipeline stages, that is a very difficult task especially for a high density compact memory array structure, is therefore eliminated. The layout for the propagation pipeline architecture according to the disclosures made in this invention is therefore greatly simplified. FIG. 2B shows that this invention can be implemented in a parallel comb or fish-bone shaped access path configuration and asynchronous propagation pipeline process through its multiple stages. Besides reducing the difficulties of clock design, compared with a total symmetric H-type structure as disclosed in a prior art patent, the fishbone or comb shaped configuration as disclosed above achieving faster cycle time and meanwhile requires less interconnects and consumes less power.

Referring to FIG. 3 for illustrating the connections and the interconnects between two propagation pipeline stages. In this particular example, one propagation pipeline decoder 120-N drives four following stage propagation pipeline decoders 120-(N+1). There is a special "combinatorial clock path" where the clock_in signal from the decoder 120-N is inputted to the clock_out line of one of the decoder 120-(N+1).

FIG. 4 is a schematic diagram showing the circuit elements of an exemplary propagation decoder 120, which has two types of components. The first type component is the address drivers 160 and the second type of component is the data drivers 170. The propagation decoder further includes a combinatorial and programmable delay gated clock driver 180 to equalize the time delays such that the different delays along different access path through multiple stages of decoders are minimized. With the difference of time delays among different access paths are reduced to almost zero, the data access process through the propagation pipelined decoders 120 can be carried out almost like a continuous flow so long as two consecutive access paths are always kept as two different routes such that the data access processes are performed in parallel.

According to FIGS. 3 and 4, this invention adopts various staged propagated clocks in any of the multiple stages of the design instead of using the regular synchronous clock or clocks, of which the relationships of the clock edges are relatively fixed across all of the design stages. In other words, the clocks used in different stages of the invention do not have the same timing edges and they are asynchronous. One example of this propagation clocking scheme is given below, in FIG. 3, the two clock-ins of Dec (N) and Dec (N+1) have two gate delay difference, one AND circuit and one BUF circuit as shown in FIG. 4, and the clock-out of Dec (N) becomes the clock-in of Dec (N+1). In other words, the clock of (N+1) stage is derived from the clock of stage (N) in this particular example. One thing needs to be noticed is that the propagation clocking domain is asynchronous in nature due to each stage has its own clock and the clock timing difference between stages can be very different from chip to chip and can also be different under the operating conditions, such as temperature or voltages difference, within the same chip.

In order to take the advantage of the asynchronous propagation pipeline operations as described above, the memory arrays are specially arranged to store data sets in a predefined manner. Specifically, for data arrays stored in the memory arrays, when a first set of memory cells and a second set of memory cells for storing two data arrays and these two data arrays are likely to be requested in two consecutive memory access operations, the memory arrays are configured for propagating through two different data access paths. Alternately, the same effects can be achieved by arranging a first set of memory cells and a second set of memory cells for storing two data arrays likely to be requested in two consecutive memory access operations are stored in two different memory arrays. By making such data storage arrangement in the memory arrays, a data access request input port is enabled to initiate a subsequent data access operation in parallel without waiting for a completion of a prior data access operation in one of the data access propagation stages.

FIG. 5A-1 is a pulse train driver and FIG. 5A-2 shows an exemplary CMOS implementations of the two types of pulse train drivers used in the propagation decoder and FIG. 5A-3 shows the pulse train timing diagram for the clock and the A input and Y output terminal. The pulse train driver is implemented with one inverter as the output driver and one pre-charge gate with only one PMOS transistor such that a high pulse (Y) is generated, when the clock and the input (A) are both high and (Y) "returning to zero", when the clock is low.

FIG. 5B-1 is a programmable delay gated clock generator (PDGC) 180 and FIG. 5B-2 shows a circuit implementation of the PDGC 180 by using a programmable capacitor 185 and an inverter 190 where the delay of the PDGC is increased by increasing the programmable capacitor 185. The differences between different paths of data access through multiple stages of decoders can be reduced to achieve a balanced decoder tree thus minimize the cycle time delays that is linearly proportional to the differences of the time delays among different access paths.

FIG. 5C is a timing diagram to show the relative timing relationships of the input and the output data and clocks of a propagation pipeline stage. The first two lines show the input clock and the input data and the third and the fourth lines show the output clock and the output data. The output clock is derived by adding the current stage delay time to the input clock, thus the output clock can also be seen as the output data ready or output data strobe signal. Furthermore, this output clock and data are sent to the following modules as the input clock and data of the next propagation pipeline stage, therefore, the input clock can also be seen as the input data ready or data strobe signal. One thing needs to be mentioned is the input and output clocks are relative to each other according to the particular stage delay. In other words, there are many local relative clocks in the propagation pipeline structure and it is different from the conventional synchronous pipeline structure, which has only one global and skew-less clock.

FIG. 5D shows an exemplary data access process where the first access path is to access memory array M0 via first Dec-1 and first Dec-2, the second access path is to access memory array M4 via the first Dec-1 and the fifth Dec-2, the third data access path is to access memory array M1 via second Dec-1 and the second Dec-2. FIG. 5E shows the timing diagram of these data access paths. By interleaving consecutive operations to different paths and using local relative clock in each propagation pipeline stage, the final data output as shown at the bottom can all lined up according to the time sequential order when these data access requests are received by Dec0 at very short cycle time, much smaller than the worst case stage delay among all stages. In other words, the propagation pipeline cycle time or how fast two consecutive operations can be issued is determined by how well the desired sequential order can be maintained and is not related to any individual stage delay. By applying the propagation-pipelined architecture throughout the whole structure, address decoding, array reading and writing, and the final read data merging, the total latency wasted due to a fixed long cycle time requirement as that implemented in a synchronous pipeline structure is eliminated. For the present invention, the whole propagation clocking scheme is carried out in an asynchronous or similar to the combinatorial manner with a fixed total path delay or a fixed operation latency, which is equivalent to adding all of the clock stage delay, and therefore the latency or the access time is independent of the cycle time and not affected by the slowing down or accelerating of the operating clock.

The cycle time of the invention is not determined by the longest stage delay. Instead, the cycle time is determined by the access and merging paths among different decoding processes. The cycle time is therefore determined by the difference of the delay times among all the paths. Since the difference of delay times among different access routes can be controlled much smaller than the stage delay of the worst stage, the cycle time of this invention is significantly smaller than the conventional synchronous pipeline design.

Therefore, it is important to minimize the path delay difference between stages and within a stage. In stead of using the expensive symmetric layout matching to achieve better balanced path delay, the invention uses the programmable delay gated clock (PDGC) driver as shown in FIG. 5B in each stage to adjust module level path difference to offset any mismatch in layout, loading, or design itself. This is also the main reason that the pulse train type drivers of FIGS. 5A-1, 5A-2 and 5A-3 are used. For there is only one timing critical delay, i.e., the rising delay not falling delay, according to FIG. 5A-3 in the pulse train design and this help converging delay difference at signal timing level.

It is well understood that smaller basic memory arrays have faster operating frequency or shorter cycle time, which can still be a limiting factor in overall cycle time calculation. However, the maximum frequency can be dramatically improved by restricting certain access pattern to memory arrays, e.g. no back-to-back or consecutive accesses to the same basic memory array. The reason for this is by eliminating this type access to the basic memory block, there is no need to wait for the long recovery time, in normal cases, it is the pre-charging time and timing margin after the actual read, and, also, there is no need to wait for the completion of the write operation any more. This special access arrangements or access restrictions will completely change the whole cycle time characteristic and allow the path delay difference cycle time theory can be applied to the whole memory design, not just the input access path or the output merging path any more.

Unlike the conventional logic where "0" and "1" signals are distinguished by high and low voltage level. The pulse train logic, e.g., FIG. 5A-3, uses pulse to represents "1" or "0" signals, with pulse means "1" and without pulse means "0". Since only the rising edge timing matters, only one type of delay (0—>1 delay) is actually used in each stage timing calculation, this further helps reducing the path delay difference within stage. Also pulse train signals can be made very fast in CMOS, due to only one MOS transistor is used in the output driver stack, this will help reducing the latency. One thing needs to be noted is pulse train signals are return to zero (RTZ) type signals as that clearly shown in FIG. 5A-3. If the RTZ type signals may also be used as output data signals, then, the simple OR network, e.g. "OR" type pulse train drivers, can be used to send the read data from inner memory array to data out terminals. One thing needs to be noted is that, due to the propagation pipeline clock scheme, the invented structure is not only asynchronous within its propagation clock stages but also asynchronous to the external memory service requesters or memory clients. This raises an issue on how to communicate with the outside world, or more precisely how to send read data to the memory requester or client. In other words, some crossing clock domain issues need to be resolved. One way to handle this is using dual clock multiple stage FIFO to transfer output data from the invented structure clock domain to the memory requester clock domain at the final stage. FIGS. 6A to 6C shows a four-level data buffer where the input data are received according to a asynchronous or irregular clock pulse from different paths as described above. The buffer then generates output according to an output clock synchronous to an external clock as that required by a data access-requesting device, e.g., the clock of a memory client.

FIG. 6C is a block diagram showing a parallel memory architecture of this invention that includes a main parallel propagation pipeline memory arrays 100 as described above that includes at least two memory sub-blocks in the system. Each memory sub-block is able to perform the complete read and write functions. The memory sub-block also includes all the necessary components or sub-modules such as the memory array(s), the in and out cells, for sensing stored data and for writing data, address decoders, for selecting specific set of memory cells, timing control, for synchronizing or scheduling events, and so forth. This memory sub-block also can directly communicate with the outside world using the regular binary digital signals, with two states 0 and 1, rather than using the analog voltage signals or the analog current signals. An external memory service client/requester 200 sends the data access request inputs and synchronous clock to an input circuit 210 that generates appropriate input address data and control signals to the main memory 100 with internal propagation clock signals. The main memory 100 applies the dynamic local-clock propagation-pipeline data access process as described above to provide data access according to the requests received from the input circuits 210. The data access output when outputted from the main memory 100 based on an asynchronous or irregular clock pulse is inputted to a dual clock crossing FIFO 220.

A redundant memory block 230 is also provided to provide redundant data when it is determined that the address for data access is pointing to a malfunctioning memory array or cell. The redundant blocks are provide such that the memory structure as disclosed in this invention may reserve and use a number of spare memory sub-blocks rather than the conventional spare rows and columns to replace and to fix all of the manufacturing defective sub-blocks identified or marked with either volatile or non-volatile registers during the manufacturing test or even during run-time field test. A multiplexing device 240 is implemented to output the redundant data when an input is received from the redundant memory blocks 230. One thing needs to be emphasized is the clock domain of the redundant block will be the same as or derived from that of the external memory requester or client.

In essence, this invention further discloses a method of propagating a plurality of signals through multiple interconnected propagation stages. The method includes a step of generating a pulse train in each of the propagation stages for inputting to a local clock of a subsequent propagation stage for initiating a local clock of the subsequent propagation stage for initiating a propagation of said plurality of signals.

As the above preferred embodiments only illustrate single input port and output port for carrying out an data access. This invention can flexibly implemented in a memory device with multiple input or output ports. FIG. 7 shows a memory device with dual input ports and dual output ports as an exemplary preferred embodiment. A person of ordinary skill in the art may flexibly implement the disclosures made in this invention to different combinations of different numbers of input and output ports and those implementations will be all within the scopes of this invention.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A method for carrying out a data access operation in a data memory device subdivided into a plurality of memory arrays each array having a plurality of memory cells accessible by an identifiable address comprising:
   asynchronously propagating in parallel a plurality of data access signals, each through a data access path over multiple propagation stages of signal lines interconnected between the memory arrays; and
   implementing an asynchronous local clock in each of the multiple propagation stages for receiving and sending said data access signals for carrying out said data access operation.

2. The method of claim 1 further comprising a step of: decoding said data access signals in each of propagation stages for directing said data access signals to propagate through different routes among said data access paths.

3. The method of claim 1 further comprising a step of: applying said local clock in a pulse train generator for generating a pulse train in a propagation stage for propagating to a subsequent propagation stage to initiate an asynchronous data access signal propagation process in said subsequent propagation stage.

4. The method of claim 1 further comprising a step of: minimizing a length of time difference between each of said data access paths in carrying out said data access operation by implementing a programmable delay gated clock in a selected set of said propagation stages.

5. The method of claim 1 further comprising a step of: asynchronously propagating in parallel a plurality of data access signals, each through a data access path over multiple propagation stages of signal lines interconnected between the memory arrays comprising a plurality of dynamic random access memory (DRAM) cells.

6. The method of claim 1 further comprising a step of: asynchronously propagating in parallel a plurality of data access signals, each through a data access path over multiple propagation stages of signal lines interconnected between the memory arrays comprising a plurality of static random access memory (SRAM) cells.

7. The method of claim 1 further comprising a step of: asynchronously propagating in parallel a plurality of data access signals, each through a data access path over multiple propagation stages of signal lines interconnected between the memory arrays comprising a plurality of static read only memory (ROM) cells.

8. The method of claim 1 further comprising a step of: asynchronously propagating in parallel a plurality of data access signals, each through a data access path over multiple propagation stages of signal lines interconnected between the memory arrays comprising a plurality of programmable read only memory (PROM) cells.

9. The method of claim 1 further comprising a step of: asynchronously propagating in parallel a plurality of data access signals, each through a data access path over multiple propagation stages of signal lines interconnected between the memory arrays comprising a plurality of erasable programmable read only memory (EPROM) cells.

10. The method of claim 1 further comprising a step of: asynchronously propagating in parallel a plurality of data access signals, each through a data access path over multiple propagation stages of signal lines interconnected between the memory arrays comprising a plurality of FLASH memory cells.

11. The method of claim 1 further comprising a step of: storing multiple sets of consecutive address data in multiple sets of memory cells ready for data access requests in consecutive address memory access operations for propagating through different data access paths.

12. The method of claim 1 further comprising a step of: storing multiple sets of consecutive address data in multiple sets of memory cells in different memory arrays ready for to data access request in consecutive address memory access operations.

13. The method of claim 1 further comprising a step of: initiating a subsequent data access operation in parallel without waiting for a completion of a prior data access operation in one of said data access propagation stages.

14. The method of claim 1 further comprising a step of: asynchronously receiving a plurality of memory access output data from said memory apparatus for outputting said memory access output data synchronized with another clock for providing said memory access output data to a memory access requesting device.

15. The method of claim 1 further comprising a step of: asynchronously receiving a plurality of memory access output data from said method into a synchronizing first-in-first-out (FIFO) buffer for outputting said memory access output data synchronizing with another clock for providing said memory access output data to a memory access requesting device.

16. The method of claim 1 further comprising a step of: storing a set of redundant data in a redundant memory designated for storing in a plurality of predetermined malfunctioned memory cells in said memory arrays whereby said redundant data is available to replace a data stored in one of said predetermined malfunctioned memory cells.

17. The method of claim 1 further comprising a step of:
configuring said method with an input port and an output port.

18. The method of claim 1 further comprising a step of:
configuring said method with multiple input ports and an output port.

19. The method of claim 1 further comprising a step of:
configuring said method with multiple input ports and multiple output ports.

20. The method of claim 1 further comprising a step of:
implementing a data access controller for directing two consecutive memory access operations for propagating through two different data access paths.

21. The method of claim 1 further comprising a step of:
implementing a data access controller for directing two consecutive memory access operating for accessing two different memory cells in two different memory arrays.

22. The method of claim 1 further comprising a step of:
implementing a data access controller for initiating a subsequent data access operation in parallel without waiting for a completion of a prior data access operation in one of said data access propagation stages.

23. A method of propagating a plurality of signals through multiple interconnected propagation stages comprising:

generating a pulse train in each of said propagation stages for inputting to a local clock of a subsequent propagation stage for initiating a local clock of the subsequent propagation stage for initiating a propagation of said plurality of signals.

* * * * *